(12) United States Patent
Krause (10) Patent No.: US 12,260,155 B1
(45) Date of Patent: *Mar. 25, 2025

(54) DATA CONVERSION SYSTEM AND METHOD FOR A CONSTRUCTION PROJECT MANAGEMENT SYSTEM

(71) Applicant: Richard A. Krause, Arlington Heights, IL (US)

(72) Inventor: Richard A. Krause, Arlington Heights, IL (US)

(\*) Notice: Subject to any disclaimer, the term of this patent is extended or adjusted under 35 U.S.C. 154(b) by 430 days.

This patent is subject to a terminal disclaimer.

(21) Appl. No.: 17/492,246

(22) Filed: Oct. 1, 2021

Related U.S. Application Data

(63) Continuation-in-part of application No. 17/133,714, filed on Dec. 24, 2020, now Pat. No. 11,321,791.

(60) Provisional application No. 63/086,441, filed on Oct. 1, 2020.

(51) Int. Cl.
*G06F 30/12* (2020.01)
*G06F 16/25* (2019.01)
*G06Q 50/08* (2012.01)

(52) U.S. Cl.
CPC ............ *G06F 30/12* (2020.01); *G06F 16/258* (2019.01); *G06Q 50/08* (2013.01)

(58) Field of Classification Search
CPC ...... G06Q 50/08; G06Q 10/087; G06F 30/12; G06F 16/258; G06E 30/12

USPC .......................................................... 705/50
See application file for complete search history.

(56) References Cited

U.S. PATENT DOCUMENTS 10,831,944 B1\* 11/2020 Giattina .................. G06F 30/13
2012/0124484 A1\* 5/2012 Robinson ............... G06Q 10/00
715/753

\* cited by examiner

*Primary Examiner* — Ariel J Yu
*Assistant Examiner* — Denisse Y Ortiz Roman
(74) *Attorney, Agent, or Firm* — Christopher J. Scott (57) ABSTRACT

A data conversion system receives and convert project design data into a unified system and language for enabling further design input management and to allow for automated construction processes within a comprehensive construction project management system. The data conversion system is operable in combination with a series of networked computers configured to implement a series of non-transitory, computer-implementable, software-based modular components allowing directional inter-module communication therebetween. A centralized design input conversion and management software module component receives data from at least one upstream software module component source and sends converted or re-formatted data to at least downstream software module component. Peripheral software module components in networked, inter-module communication with the centralized design input conversion and management software module component are thereby enabled to perform peripheral software module component functionality.

33 Claims, 6 Drawing Sheets

FIG. 5
AUTOBUILD 2020

FIG. 6

Design Input Conversion & Management

DATA CONVERSION SYSTEM AND METHOD FOR A CONSTRUCTION PROJECT MANAGEMENT SYSTEM

PRIOR HISTORY

This application claims the benefit of U.S. Provisional Patent Application No. 63/086,441 filed in the United States Patent and Trademark Office (USPTO) on 1 Oct. 2020; and is a Continuation-in-Part application of U.S. patent application Ser. No. 17/133,714 filed in the USPTO on 24 Dec. 2020, the specifications and drawings of both of which applications are hereby incorporated by reference thereto.

FIELD OF THE INVENTION

These specifications generally relate to a system for managing a construction project, and more particularly to a system for converting project design data into a unified system and language for enabling further design input management and to allow for automated construction processes.

BRIEF DESCRIPTION OF THE PRIOR ART

US Patent Application Publication No. 2020/0151937, authored by Miller (937 Publication), discloses a Method and System for Construction Project Management Using Photo Imaging Measurements. The '937 Publication describes harnesses the use of photo imaging and measurement capture for use by do-it-yourselfers, handymen and small contractors. The method and system operates on mobile computing devices and includes an image recognition system. By performing various imaging-based measurements and then processing the resultant data, the method and system produces bills of materials. invoices, and receipts for the necessary tools and materials required by the construction project.

US Patent Application Publication No. 2020/0027043, authored by Agassi, et al. ('043 Publication), discloses a Construction Project Management System and Method Thereof. The '043 Publication describes a management system including processing circuitry and a memory, the memory containing instructions that, when executed by the processing circuitry, configure the system to: analyze a project data of a construction; based on the analysis of the project data, derive metadata associated with the construction project, wherein the metadata designates at least various stages associated with the construction project, and a completion threshold for each stage; and based on the metadata, generate an interface for allowing at least two end-user devices to collaboratively interact with the interface, wherein the interface provides interactive visual features indicative of a progress of each of the stages associated with the construction project.

US Patent Application Publication No. 2019/0003153, authored by Shike, et al. ('153 Publication), discloses a Construction Management System, Construction Management Method, and Management Device. The '153 Publication describes a management system including an object detecting unit mounted on a work machine and configured to detect an object in a construction site and output information on the object; a shape detecting unit configured to output shape information indicating a three-dimensional shape of the object by using the information on the object detected by the object detecting unit; an information attaching unit configured to attach, to the shape information, time information indicating a time when the object is detected; and a management device configured to generate current state information on the construction site on the basis of the shape information to which a latest piece of the time information is attached.

US Patent Application Publication No. 2019/0026843, authored by Kim ('843 Publication), discloses a Method for Integrated Management Including Building Construction and Maintenance Based on Video. The '843 Publication describes a video-based integrated building construction and maintenance management method in which a series of processes of building construction and maintenance after build completion is produced as a video and registered in a building management server. The video is configured to be checked by a building owner or resident so that a building can be transparently managed by fundamentally preventing faulty construction that may occur during a construction step and untrustworthy maintenance.

US Patent Application Publication No. 2018/0332102, authored by Sheidaei ('102 Publication), discloses a Cloud-Based System for Collaborating Engineering, Operations, Maintenance, Project Management, Procurement, and Vendor Data and Activities. The '102 Publication describes certain systems and methods operable via a cloud platform utilizing Artificial Intelligence (AI). The system is configured to connect with a computerized application to store and manage data and activities of one or more departments.

The system enables vendors to access the data of one more departments to perform vendor activities such as generating quote documents. The system is further configured to provide a bid evaluation including a list of one or more vendor comprising products matching the requirements of the one or more departments. The system further enables personnel of one or more departments to select at least one vendor for placing orders and enables the selected vendor to submit data required by the personnel of one or more departments to collaborate data or for procurement.

US Patent Application Publication No. 2018/032225, authored by Schwartz ('225 Publication), discloses a System for On-Site Tracking, Managing, Planning and Staging Construction Projects. The '225 Publication describes a construction management system for allowing a user to capture an item identifier from an item (e.g., shipment, group of components, and/or one or more components) using a mobile device. The item identifier may be used to identify a project and access a model for the product, identify a component in a model, and/or identify the components in a shipment for staging purposes.

Moreover, the system may be used to identify a status for the one or more components. The status may be that the one or more components are shipped, received, staged for assembly, installed, or the like. The status of the one or more components may be automatically updated by capturing the item identifier. Moreover, the user may also select shipment information for past, current, and/or future shipments in order to identify the one or more components associated with each of the shipments.

US Patent Application Publication No. 2018/0209156, authored by Pettersson ('156 Publication), discloses a Construction Management System and Method. The '156 Publication describes a construction management system for constructing a building including at least one heavy lifting machine for moving a one building element to a mounting position on the building, a central computing unit providing a building information model comprising at least a construction plan comprising a target state of the building construction, a three-dimensional model of an actual construction state of the building, and a three-dimensional model of the element, wherein the central computing unit is adapted to determine the mounting position for the element based on the construction plan, the model of the current construction state and on the model of the element.

US Patent Application Publication No. 2018/0174250, authored by Faulkner ('250 Publication), discloses certain Construction Project Management Systems and Methods. The '250 Publication describes an operation including the steps of generating a project profile for a construction project, determining project details of the project, determining a regulatory process to be performed during the project based on the project details and regulatory rules, determining worker's certificates or licenses corresponding to the regulatory process and the project details, determining candidate workers for the construction project from registered workers, and causing a first GUI for selection of one or more candidate workers to be generated. The first GUI includes indicators of statuses of the worker's certificates or licenses corresponding to the regulatory process with respect to each of the one or more candidate workers.

US Patent Application Publication No. 2017/0278037, authored by Pettersson ('037 Publication), describes a Construction Management System and Method for Linking Data to a Building Information Model. The '037 Publication describes a construction management system comprising a plurality of sensor means adapted to detect events at a building site of the structure, a central computing unit providing a three-dimensional model of the building site, and at least one displaying device that is adapted to display the three-dimensional model to a user. The sensor means are adapted to generate data comprising information about a detected event.

The system further comprises communication units adapted to transmit a message comprising the data and a location information to the central computing unit, assign coordinates in the three-dimensional model according to the location information, evaluate options for reacting on the event by analyzing the data, assign evaluated options to the data, and display a note which is related to evaluated options to the user in real-time at the assigned coordinates in the three-dimensional model.

U.S. Pat. No. 10,831,944 ('944 Patent), issued to Giattina, discloses a System and Method to Facilitate the Design, Manufacturing and Construction of Structures. The '944 Patent describes a system that facilitates the building of a structure according to a project architectural design plan. The system provides standardized information to participants associated with a project based on the project design plan. The project architectural design plan can be compliant with one or more standards stored by the system. The project design plan can also incorporate information regarding products that are utilized in the project such as a plurality of prefabricated building modules. The requirements for a product are dictated by the standards established for the product and the project. Information about products used in the project can be embedded in links of the project architectural design plan.

U.S. Pat. No. 10,593,104 ('104 Patent), issued to Robert, et al., discloses certain Systems and Methods for Generating Time Discreet 3D Scenes. The '104 Patent describes certain methods, systems, and apparatus including medium-encoded computer program products for generating and visualizing 3D scenes of a build-site. The invention may be said to include, in one aspect, a method including: obtaining site data acquired by one or more capture devices, wherein the site data comprises data sets corresponding to two or more locations about a physical site, and each respective data set comprises (i) imaging data of the physical site, (ii) coordinate data for the imaging data, and (iii) time metadata for the imaging data. The methodology further reconstructs and outputs a series of three dimensional (3D) modeled scenes of the physical site from the site data using the imaging data, the coordinate data, and the time metadata.

Generally considering the state of the art exemplified by the patent publications briefly described above, the reader will bear in mind certain shortcomings in the construction industry at least insofar as its relatively low-level digitalization is concerned. In other words, the reader will note from a consideration of the foregoing that the state of construction industry art perceives a need for a digitalized comprehensive construction project management system that receives design component data from an outside design provider, converts the design component data into a standardized format for use by a plurality of interconnected system-supportive, software-based modules or components to advance the initial design component data from design concept to final build all within a system of full or near-full automation. What follows is a summary of the present invention as described in more detail following the prefatory summary.

SYSTEM BACKGROUND AND SUMMARY

In the world's pursuit to automate construction there is a need to develop a common language/communicator for all the many aspects of the entire process starting with a concept and need to design and build a facility. The many parts to the process include but are not limited to: facility needs, concept design, design development, construction documents, permitting, pricing, bid solicitations, scheduling, bid & pricing evaluations, contracting, procurement, deliveries, quality control, process coordination, progress verification, financial accounting, final completion checklists, etc. The construction industry perceives a need for significant improvement in terms of progression towards automation, and in this regard, there exists a need for a common communicator and organizer that understands all of the parts to the process and allows/enables communication and organization amongst the various parts in a way that is understood by all as if working within one.

The AUTOBUILD CONVERSION system according to these specifications is a sub-system to a construction automation process or software-based systemic component that performs data conversion of the initial design data of a construction project (that exist in the market today) and creates a communication system for enabling multiple other activities and systems required to automate the process of construction from concept all the way through the physical assembly of parts and pieces to provide the final intended constructed product.

The conversion and communication created by the AUTOBUILD CONVERSION component or Module (as a key building block of software applications, programs, or routines that support the larger project management system as otherwise described in the '714 Application) comprises the accommodation of design review, schedule development, pricing, bid solicitations, contracting and procurement, financial accounting, and all aspects of the management of the physical assembly of the project. The AUTOBUILD CONVERSION component or Module further provides initial, intermediate and final data traffic management and data formatting for tracking, calculating, managing, and communicating multiple aspects of the construction process for enabling successor or peripheral modules to successfully carry out their functions.

BRIEF DESCRIPTIONS OF THE DRAWINGS

Other features and objectives of the present invention will become more evident from a consideration of the following brief descriptions of patent drawings.

DETAILED DESCRIPTION OF THE PREFERRED EMBODIMENT

In describing the invention made the subject of these specifications, since AUTOBUILD CONVERSION is a subpart or subsystem to an overall software-based construction automation process (i.e., an automated construction process without human intervention), it is here referred to as a Module, or in this case Module B. A software program may comprise numerous modules as separate executable files that form parts of a whole program. A module is a software component or part of a program that contains one or more routines. One or more independently developed modules make up a program. An enterprise-level software application may contain several different modules, and each module serves unique and separate business operations. Given the complexity of the overall operating system, the author has selected the term module to describe the software modules that together cooperate to provide or support the Comprehensive Construction Project Management System of U.S. patent application Ser. No. 17/133,714 ('714 Application) from which this application claims a benefit and is a Continuation-in-Part Application.

Module B is a software-based interface system between incoming Project Design Data (as provided by state-of-the-art Module A nodes) and a Project Data Survey, Code Match & Organize Module C as otherwise introduced in the '714 Application. Referencing FIG. 1, for example, it will there be seen the System Conversion and Data Entry Node B5 of Module B as at 105 is in downflow communication with Project Design Data node 95 for receiving data therefrom and is in upflow communication with various nodes of the Project Data Survey, Code Match & Organize Module C. Module B further comprises Nodes BG1, BG2, and BD1 shown in spur-like termination points given the simplified version of the nodal environment. Node BG1 is a nodule for establishing project control points and GPS as referenced at 91; Node BG2 is a Special Consideration Needs node referenced at 92; and Node BD1 is an Initial Sequence Scheduling node referenced at 93.

Figure 1:
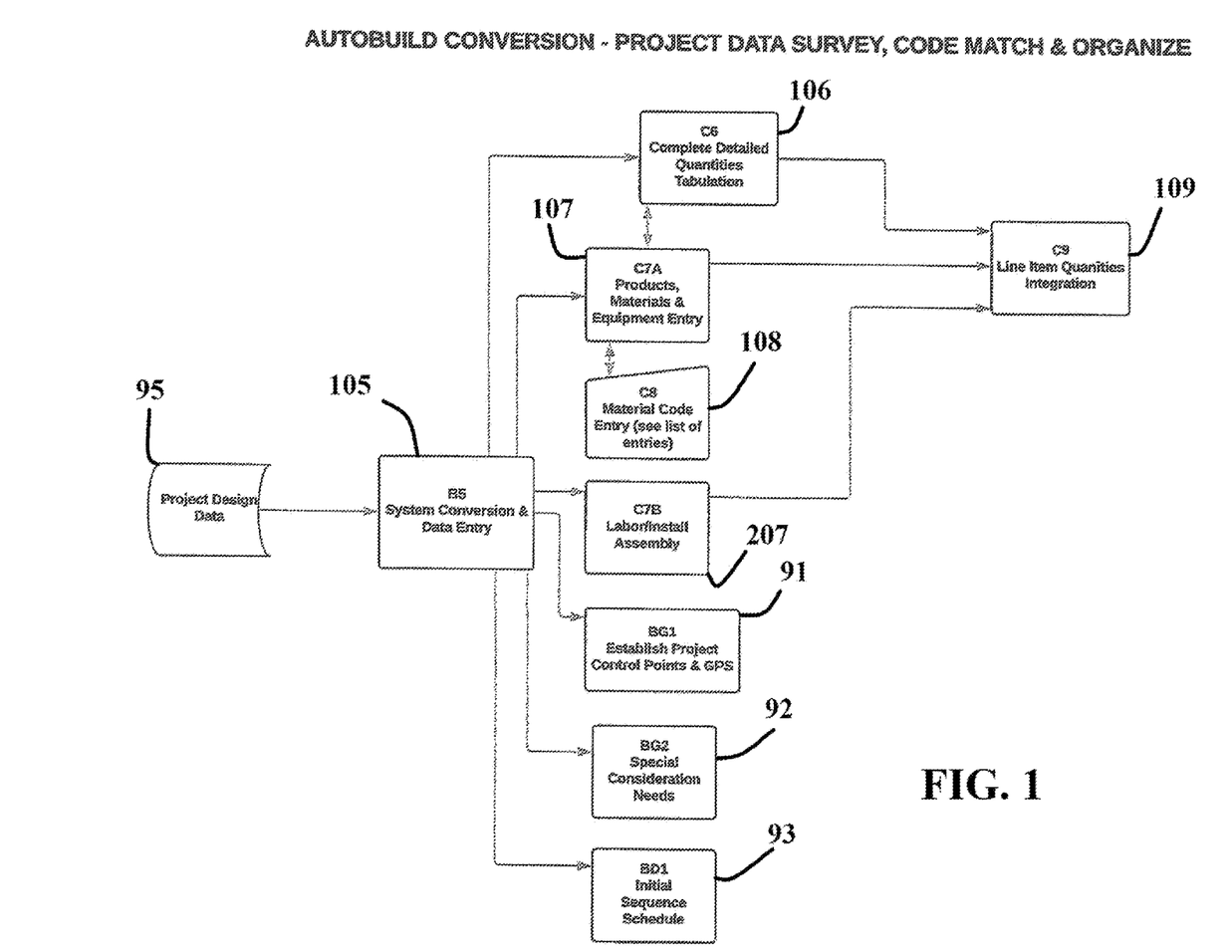
FIG. 1 is a first simplified flowchart diagram depicting a centralized or hub-like System Conversion and Data Entry software module or node in downflow communication from a singular Project Design Data software module or node with a first series of branching software modules or nodes in downflow communication from the System Conversion and Data Entry software module.

The AUTOBUILD CONVERSION Module B intelligence receives Project Design Data 95 that currently exists in the market, reads that data, determines in which category the data belongs, then categorizes the data to be used to communicate and help manage other systems tied to the data that carry out various aspects of the process of construction such as bid tabulations, bid solicitations, price comparisons, execution of contracts, construction scheduling systems, GPS and placing systems, and on-site monitoring and placing systems that deliver and place parts together to build a building project.

More particularly, the AUTOBUILD CONVERSION Module B deciphers the Project Design Data resolving what data is placement data, what data is location data, what data is material data, what data is equipment data, what data is color data, what data connects to industry product catalogs, what data requires material procurement, what data requires installation, what data requires connection, what data requires further information, etc. Module B then organizes and categorizes this data into different bins so that the data can be retrieved by other parts of the system in need of the data within certain bins to carry out specific functions.

For the AUTOBUILD CONVERSION Module B to be comprehensive, there is need for it to have additional sub-functionality. A second systemic Sub-module according to the present invention is a Project Data Survey, Code Match & Organize Module denoted or referenced at Module C. The Project Data Survey, Code Match & Organize Module C according to the present invention codes and quantifies each and every specific piece or element of material and equipment needed to complete the project. The coding and quantification Module C further summarizes material and equipment requirements into a cost estimate summary by creating an itemized tabulation of each part of the project and required quantities. This itemized tabulation presents a notice of need for pricing on material, labor, equipment, appurtenances, etc. that are needed for each line item of the tabulation.

To achieve this, the Project Data Survey, Code Match & Organize Module C receives information from the AUTOBUILD CONVERSION Node B5 as at 105 and codes every component of the finished product from micro-assembly materials such as screws, adhesives, and other types of fasteners that are needed to macro-assembly materials such as structural steel, Heating, Ventilation, & Air-Conditioning (HVAC) components and electrical types of material and equipment required to complete the building.

The Project Data Survey, Code Match & Organize Module C further quantifies all the parts and pieces of the proposed building and organizes the information into a system that produces a line-item cost accounting that is further utilized to track every component of the project. This allows each component to be noted for developing information to be utilized in producing the next step in the process such as: costing & price solicitation, scheduling, contracting, procurement tracking, delivered to the jobsite, positioning & placement, etc. This component also alerts the architect to any missing or conflicting information including finer item details required for the project exemplified by missing fasteners, a specification for a particular adhesive that is required, and/or requirements for missing flashing that could cause water infiltration.

The Project Data Survey, Code Match & Organize Module C provides a central role in support of the present invention insofar as its provision of anticipatory planning for eliminating conflicts, delays, and last-minute missing details that often delay projects and increase costs. This module further partially manages initial stage quality control and coordinates with on-site monitoring systems to confirm that the components directed into the project are per the specifications as designed and are competent, compatible, and comprehensive, etcetera.

In this regard, the system contemplates requiring the architect/designer or A/E to specify each individual component from a built-in catalog and provides a coding system for allowing the architect/designer or A/E to select options from those materials that are compatible with the design intent with built-in flexibility for allowing bidding contractors to select from more than one option if desired.

Figure 2:
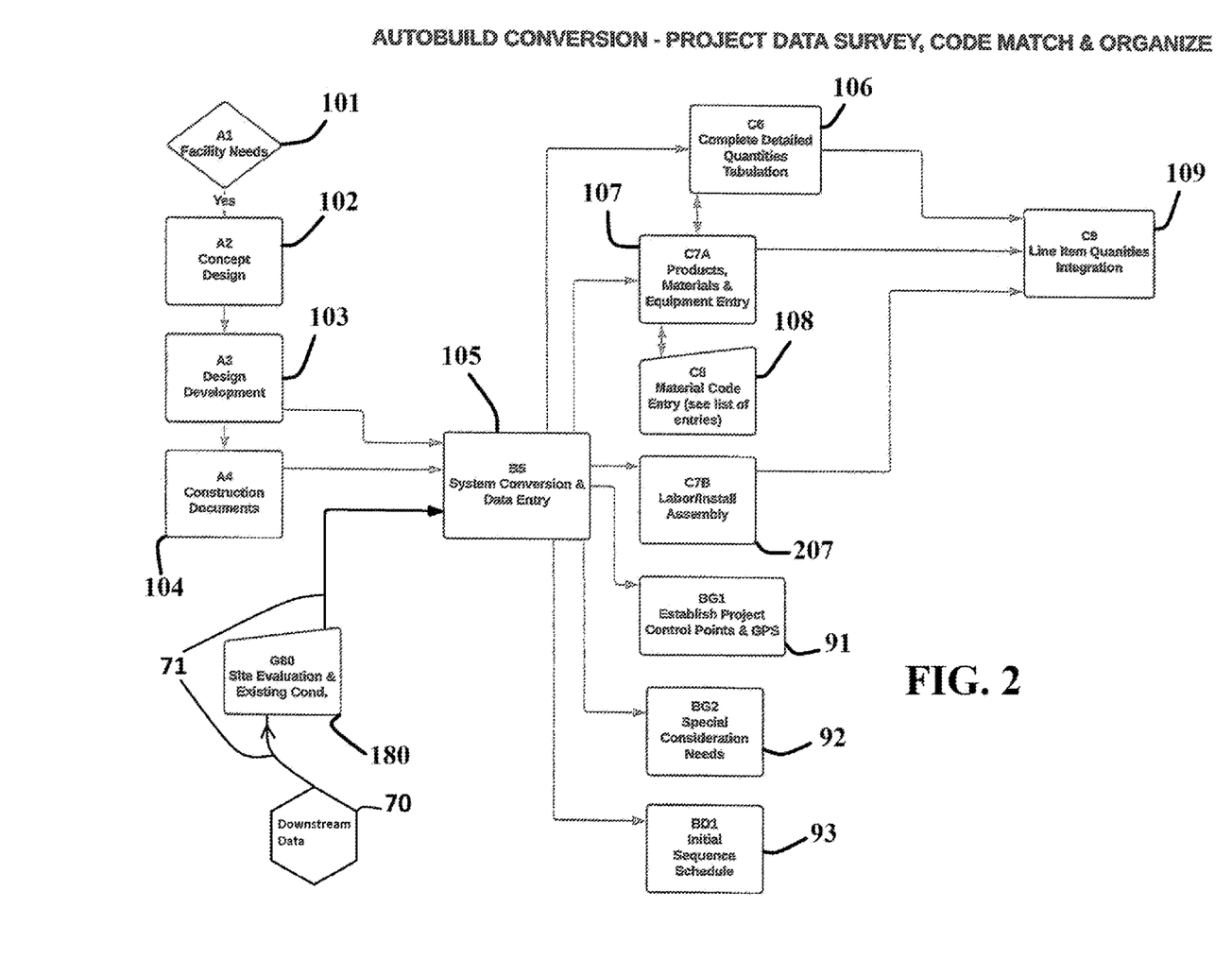
FIG. 2 is a second flowchart diagram more detailed as compared to the first simplified flowchart diagram of FIG. 1 further depicting the centralized System Conversion and Data Entry software module or node in downflow communication from a series of data input streams with the first series of branching software modules or nodes in downflow communication from the System Conversion and Data Entry software module.
Figure 5:
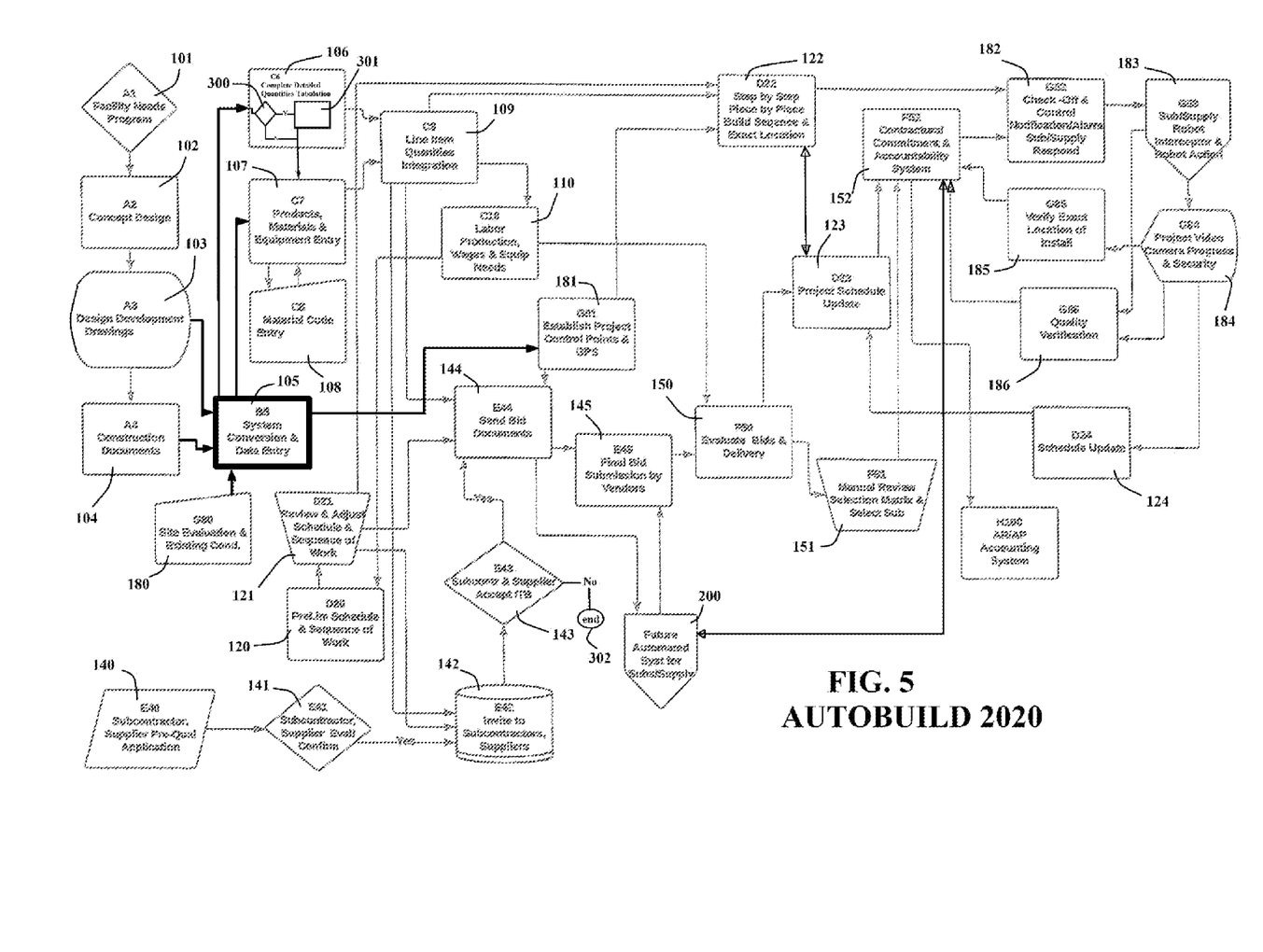
FIG. 5 is a master flowchart diagram depicting directional flow, relationships, and interconnectivity of various systemic modules supportive of the AUTOBUILD 2020 system according to the present invention.
Figure 6:
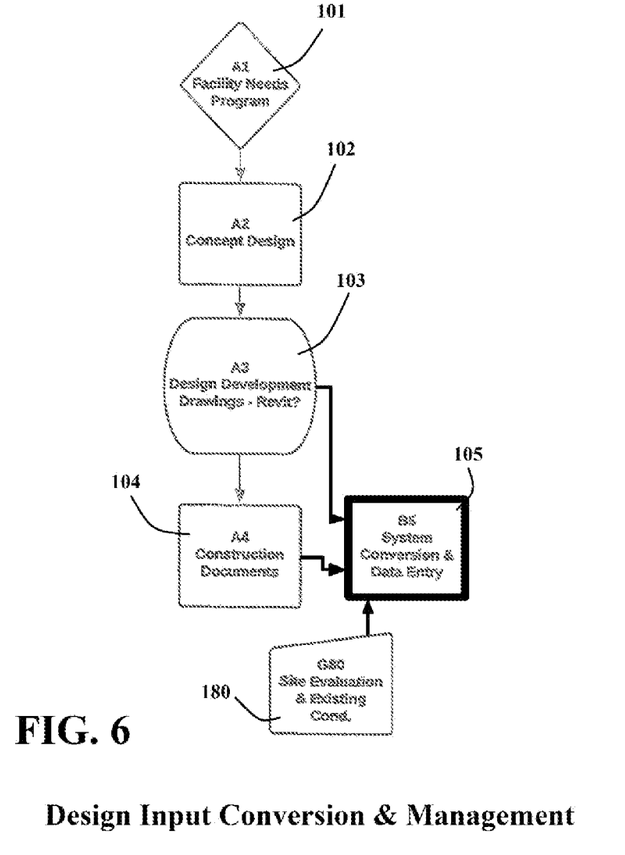
FIG. 6 is a fifth flowchart diagram of the central first systemic Data Input Conversion & Management Module B further simplified as compared to FIG. 1 with peripheral module components interconnected therewith for inputting data therein according to the present invention.

Comparatively referencing FIG. 2 versus FIGS. 5 and 6, the reader will there consider an expansion of node components as compared to the node components detailed in FIG. 1. Comparatively referencing Node B5 as at 105 in FIGS. 1 and 2, and as highlighted in boldface lining in FIGS. 5 and 6, the reader will there consider a System Conversion and Data Entry Node 105 substantially equivalent to the AUTOBUILD CONVERSION Module B prefaced above. This is the entry point or component of the system that receives the design development drawings as provided by the A3 Node as at 103 and the construction documents as provided by the A4 Node as at 104. In other words, the B5 Node or Module 105 operates as a portal for receiving electronic design information from the general contractor or A/E (Design) industry professional. The B5 Node or Module 105 receives and converts the electronic design information and design intent into an information file to be used to communicate to other automation systems needed to carry out the entire completion of the project and as such is central to the practice of the present invention.

Specifically referencing FIG. 2, the reader will there consider the A1, A2, A3, and A4 Nodes as at 101, 102, 103, and 104, respectively. The following is a narrative of the function of the A1-A4 Nodes as referenced at 101, 102, 103, 104, which nodes feed Project Design Data 95 into the AUTOBUILD CONVERSION Module B, and thus technically fall outside the scope of the present invention although it should be noted the AUTOBUILD CONVERSION Module B necessarily Project Design Data input from the A nodes so as to properly convert incoming data for the purpose of managing the remainder of the project.

The A1 Node referenced at 101 is a Facility Needs and Programming Node. This is the first stage of a project where an outside owner/customer decides it/she requires a facility or expansion and communicates the requirement to an Architect or Engineer or A/E. The Architect or Engineer (A/E or Design) industry professional creates a framework called Facility Needs and Programing as at 101. This framework sets the criteria with which to start designing the facility including such facility aspects as size, level of floors, functions, special equipment accommodation, special climate control, level of finishes, access needs, etc.

The A2 Node referenced at 102 is a Conceptual Design Node. This is a node state in which the A/E (Design) industry professional completes an initial design of the facility for the owner/customer to review. This node provides the first few steps the design professional takes to make sure the design professional's vision for the project is in agreement with the vision the owner/customer has for the facility so as to avoid spending substantial amounts of time and cost developing a design that is otherwise developing in a disagreeable direction as dictated by the owner/customer.

The A3 Node referenced at 103 is a Design Development Drawings Node. This is a development phase in which the A/E (Design) industry professional completes the design in further detail and begins providing specifications on form and function along with material support for the project. This is an intermediate step in which the design is considered approximately 70-80% complete. It sets a milestone for another review with the owner/customer to confirm the design meets the needs of the owner/customer. This stage also allows contractors to start reviewing the facility and design to provide initial pricing for the owner/customer to ensure the project is being designed within the allocated budget.

The A4 Node as referenced at 104 is a Construction Documents Node. This development phase or state occurs when the A/E (Design) industry professional completes the design with final details or specifications. It includes the finer specifics of each element of the project, and specifies each material to be used to the specifics of color, manufacture, special requirements, etc. The AUTOBUILD CONVERSION Module B according to the present invention is designed to receive the Construction Documents and analyze the Construction Documents for errors or inconsistencies.

In other words, the Project Design Data 95 input is received and reviewed by the AUTOBUILD CONVERSION Module B for identifying specifics that have not been provided or designed and thus the A4 Node 104 can be optionally completed with the AUTOBUILD CONVERSION Module B according to the present invention. The reader will again note that Nodes 101-104 are not included in AUTOBUILD CONVERSION Module B according to the present invention, but are direct, critical inputs from the A/E industry in state-of-the-art formats currently available in the market.

For example, the System Conversion & Data Entry of Module B5 as at 105 may preferably operate to receive an AUTODESK® Revit or AUTOCAD® design file as provided by Autodesk, Inc., a Delaware Corporation with business address of 111 McInnis Parkway, San Rafael, California, 94903. The AUTOBUILD CONVERSION Module B receives Project Design Data 95 via Node B5 105, and converts the Project Design Data 95 provided by the incoming design file, which converted data is recognized by other automation or, until then, an individual person to carry out all the tasks needed to complete the pricing and construction of the project.

The reader will further note that Node 105 further operates to receive data input from a Site Evaluation and Existing Conditions G80 Node as at 180 in upflow communication with the B5 Node or Design Input Conversion & Management Module B as at 105. The data provided by this entry point G80 Node 180 derives from existing knowledge, data and documents depicting the current site conditions along with GPS and camera monitoring systems to evaluate site conditions needed to be considered for the construction of the project.

The G80 Node 180 assists in providing data concerning all types of site conditions such as existing structures on the site, existing utilities, topographic elevations of the site, water flow and sheeting across the site, locations of existing curbs, paving, and other traffic right-of-way's, etc. The G80 Node as at 180 is utilized in the planning of the project, determination of scope, and coordinating project site logistics.

Node C6 as at 106 is a Detailed Quantities Tabulation Node in unidirectional downflow communication with the B5 Node as at 105. The Detailed Quantities Tabulation Node 106 operates to identify and quantify each specific material piece or required for the project in detail from large equipment and structural components such as excavation cut and fills, steel members, electrical conduits, and masonry flashings to smaller items such as fasteners (e.g. screws and nails) and adhesives. If an element or piece appears to be missing from the design specifications to complete the project, an RFI alert is communicated in a Request for Information document or RFI format before the entire process can be calculated and completed. The Detailed Quantities Tabulation C6 Node 106 ensures that every piece of material required for the project has a quantity.

Node C7A as at 107 is a Materials, & Equipment (Product) Designations Node in unidirectional downflow communication with the B5 Node 105. The Materials, & Equipment (Product) Designations Node 107 ensures that every material element and piece of equipment is properly identified as to exactly what it is as required in the development of the specifications describing all products required for the project. When the system identifies an element that is required, but not yet specified, the system will prompt the user with a notice that a product has not been specified. C7A as at 107 may optionally suggest a preferred product or material element. This node will also attach an initial notifier to be used down the system to help manage those materials and equipment items that need to be submitted for final review before it's procured and to be utilized by delivery systems to manage and track the delivery of these items to the jobsite.

Node C8 as at 108 is a Product Code Entry & Database Node in bidirectional communication with Materials, & Equipment (Product) Designations C7A Node 107. The Product Code Entry & Database Node 108 is the port of entry for selecting and specifying each material and piece of equipment (Product). The Product Code Entry & Database Node 108 builds a database of all materials and pieces of equipment that are utilized in the industry for building facilities.

Product Code Entry & Database Node 108 is preferably designed to provide a selection process that can either be manually updated or automatically updated as necessary for matching and entering all products required for the project. The material code entry listing data may preferably include, but not be limited to (1) Building Product and Construction Material Division Number(s) data; (2) Type(s) of Material data; (3) Long Lead Item(s) data; (4) Weather Sensitivity data; (5) Required Predecessor data; (6) Special Requirements data; (7) Weight data; (8) Size (data); (9) Color data; and (10) Quantity data (if known).

Node C7B as at 207 is a Labor/Install Assembly Node in unidirectional downflow communication with the B5 Node 105. The Labor/Install Assembly C7B Node 207 ensures that every line item involved with the construction of the facility requiring physical assembly is distinguished and identified. This note shall also initially categorize the types of activities and organize them into groupings such that are common for typical trades. This organization will allow for ease as this data/information gets distributed and used in a bid solicitation process so that vendors that perform certain groupings of trades shall be delivered a package that best suits them. This node will also organize and manage the necessary assembly tasks in a way that can easily be distributed to the next step down the line that provides assembly of an entire line item or estimate bid summary.

Node C9 as at 109 is a Line Item Quantity Integration Node in unidirectional downflow communication with the Materials, & (Product) Designations C7A Node 107, the Product Code Entry & Database Node 108 and the Labor/Install Assembly C7B Node 207. The Line Item Quantity Integration Node 109 creates the first stage of the cost estimate summary by combining and tabulating data as received from Nodes 107, 108 and 207. The Line Item Quantity Integration Node 109 organizes all products needed for the project with the required quantity in a spreadsheet-like format and further communicates the organized information clearly so that associated costs can be solicited.

The Site Evaluation & Existing Conditions G80 Node is referenced at 180 in upflow communication with the B5 Node as an entry point for inputting existing knowledge, data and documents depicting current site conditions along with GPS and camera monitoring systems to evaluate site conditions needed to be considered for the construction of the project. In this regard, the G80 Node as at 180 is a hybrid type of node and has A Module or A Node characteristics at least insofar as it provides site assessment functionality for setting up the known information of the project site to feed the B5 Node with site information.

The G80 Node is utilized in the planning of the project, determination of scope, and coordinating project site logistics. The G80 Node is also in indirect communication with an Establishment of Project Control Points & GPS Node as it feeds into B5 to be deciphered and organized to feed into the Establish Project Control Points & GPS BG1 Node as at 91 for more properly developing all project control points, and is basically a utility in establishing and setting all control points and GPS locations for the project. The primary function of the BG1 Node 91 is to set up the initial organization and programing data information to be later exported out to the GPS-placing assembly and location verification systems, i.e. computers, robots, drones, (e.g., non-human participants), individual persons, etc. that are the downstream components of the complete building process.

Because the design and needs of unique projects can often bring rare or uncommon elements to a project, the B5 System Conversion & Data Entry Node recognizes those items that may not necessarily find its way to be easily exported to any particular system downstream. Node B5 takes this type of rare or uncommon element and sends it to the Special Consideration Needs BG2 Node as at 92. The BG2 Node 92 provides a safekeeping function ties loose ends so as to ensure project completion. The BG2 Node 92 sends out notice(s) to an individual person operating the system with a list of RFI's and alerts for these rare and uncommon elements to be managed properly. Once managed by human intervention, and provided with any additional information required, the information developed by the node can be injected back into the system to be managed in an automated manner.

The scheduling of a project is a very important component to the overall building process. the B5 System Conversion & Data Entry Node 105 extracts the design, site evaluation and existing conditions information in a manner that can be used by the downstream scheduling systems that are needed to identify and track the timelines within the entire planning and construction process. The purpose of the BD1 Initial Sequence Schedule Node 93 is to decipher and organize information from the design, site evaluation and existing conditions so that it can be exported and distributed to scheduling software that is both currently out on the market or will be developed in the future to be more compatible with automated construction, as for example Artificial Intelligence (AI) based platforms as discussed in US Patent Application Publication No. 2018/0332102 and authored by Sheidaci as introduced hereinabove.

The working parts of the Design Input Conversion & Management software component in concert with related elements within these specifications together cooperate with one another to generally vet and correct a project design to ensure its competency down to the most minor details. This is necessary in the modern world simply to avoid the number of errors and delays that take place on a construction site. Vetting and/or correcting project designs is a critical aspect of the Design Input Conversion & Management software component to provide precise and accurate information and direction to enable computers, robots, drones, etc. (i.e., non-human participants) to carry out a project design in an automated manner. The Design Input Conversion & Management software component vets at least the following: design intent; compatibility of materials and their connections to other materials; material strengths; structural integrity; moisture contents; colors; precise locations in the intended three-dimensional envelope, etc. The Design Input Conversion & Management software component very basically ensures the project design and information provided in support thereof are competent, compatible, and comprehensive toward the intended design.

Figure 3:
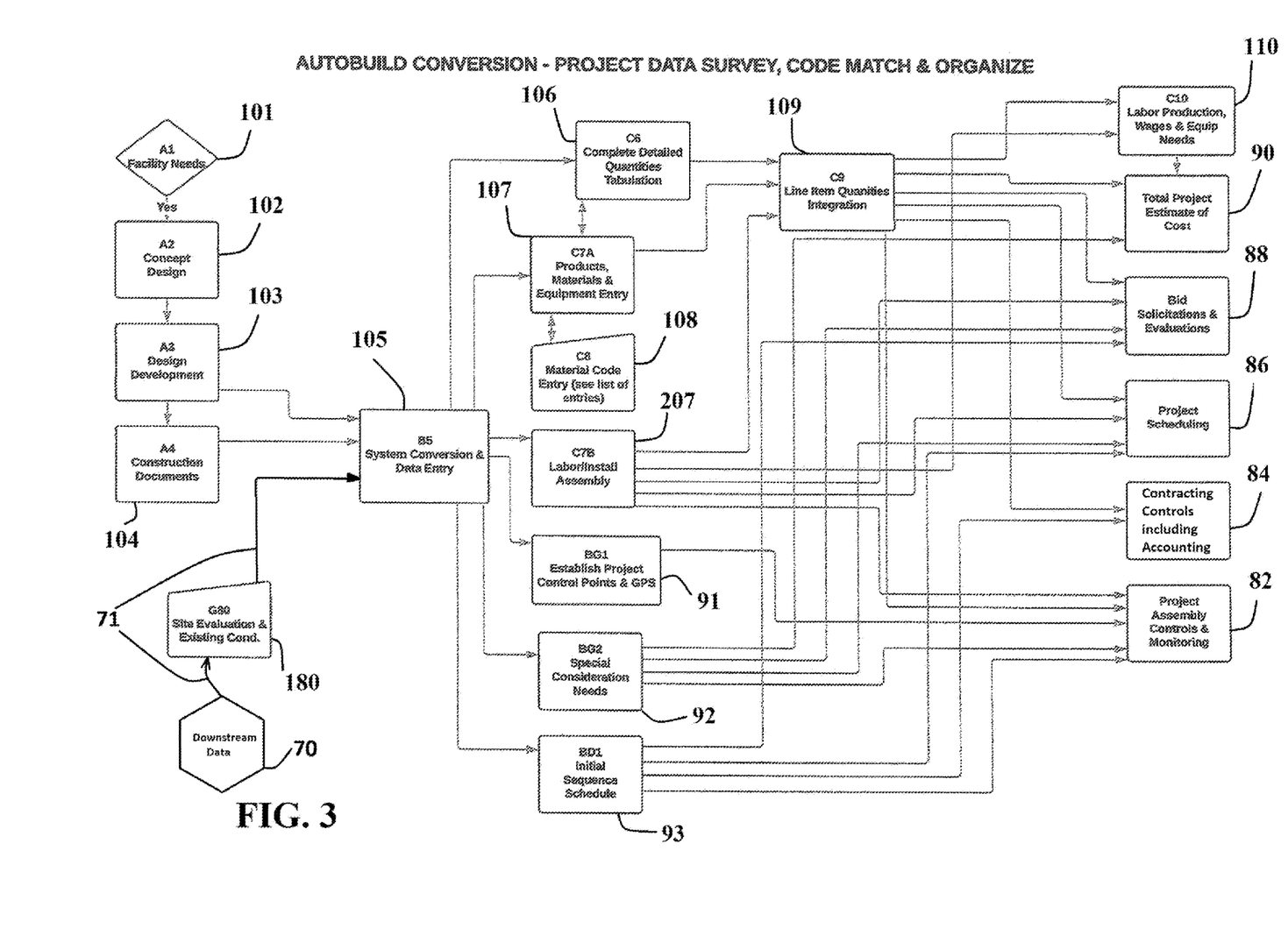
FIG. 3 is a third flowchart diagram more detailed as compared to the second flowchart diagram of FIG. 2 further depicting the centralized System Conversion and Data Entry software module or node in downflow communication from the series of data input streams with the first series of branching software modules or nodes in downflow communication from the System Conversion and Data Entry software module, and a second series of branching software modules or nodes in downflow communication from the first series of branching software modules or nodes.

Referencing FIG. 3, the reader will there consider the illustrated need and comprehensiveness of the AUTOBUILD CONVERSION Module B. FIG. 3 depicts how the information received by the AUTOBUILD CONVERSION Module B is organized, managed and distributed to all other aspects of a complete construction process. Although this invention does describe in detail the following listing of technologies, the listing is here included to bring to the reader's attention all the aspects of the downstream components and processes of construction that are considered by AUTOBUILD CONVERSION for further export with full comprehension to downstream components so that a complete automated construction process can take place. Referencing FIG. 3, the reader will note certain exemplary downstream components are, but not limited to:

1. C10—Labor Production, Wages & Equipment Needs as at 110
2. Total Project Estimate of Cost as at 90
3. Bid Solicitation & Evaluations as at 88
4. Project Scheduling as at 86
5. Contracting Controls, including Project Accounting as at 84
6. Project Assembly Controls & Monitoring as at 82

The foregoing is an exemplary listing of certain primary downstream components and, for ease of illustration, does not necessarily list some of the finer details of the construction process that AUTOBUILD CONVERSION will apply and export to. Comparatively referencing FIGS. 3 and 4, the reader will see that FIG. 4 sets forth substantially the same illustrative matter as in FIG. 3, but further illustrates how the above list of downstream components 82, 84, 86, 88, and 90 cross-communicate or communicate in a bi-directional manner as at 94 to support the finished product as at 415. The AUTOBUILD CONVERSION Module B provides the infrastructure support for accommodating the cross communication 94 of the downstream components 82, 84, 86, 88, and 90 as exemplified. For the most part this is achieved by the common categorization, organization, communication and management that is being utilized within the AUTOBUILD CONVERSION Module B as supported by the Project Data Survey, Code Match & Organize Module C so that all systems cooperate and function to seamlessly advance the project toward the finished product 415.

Figure 4:
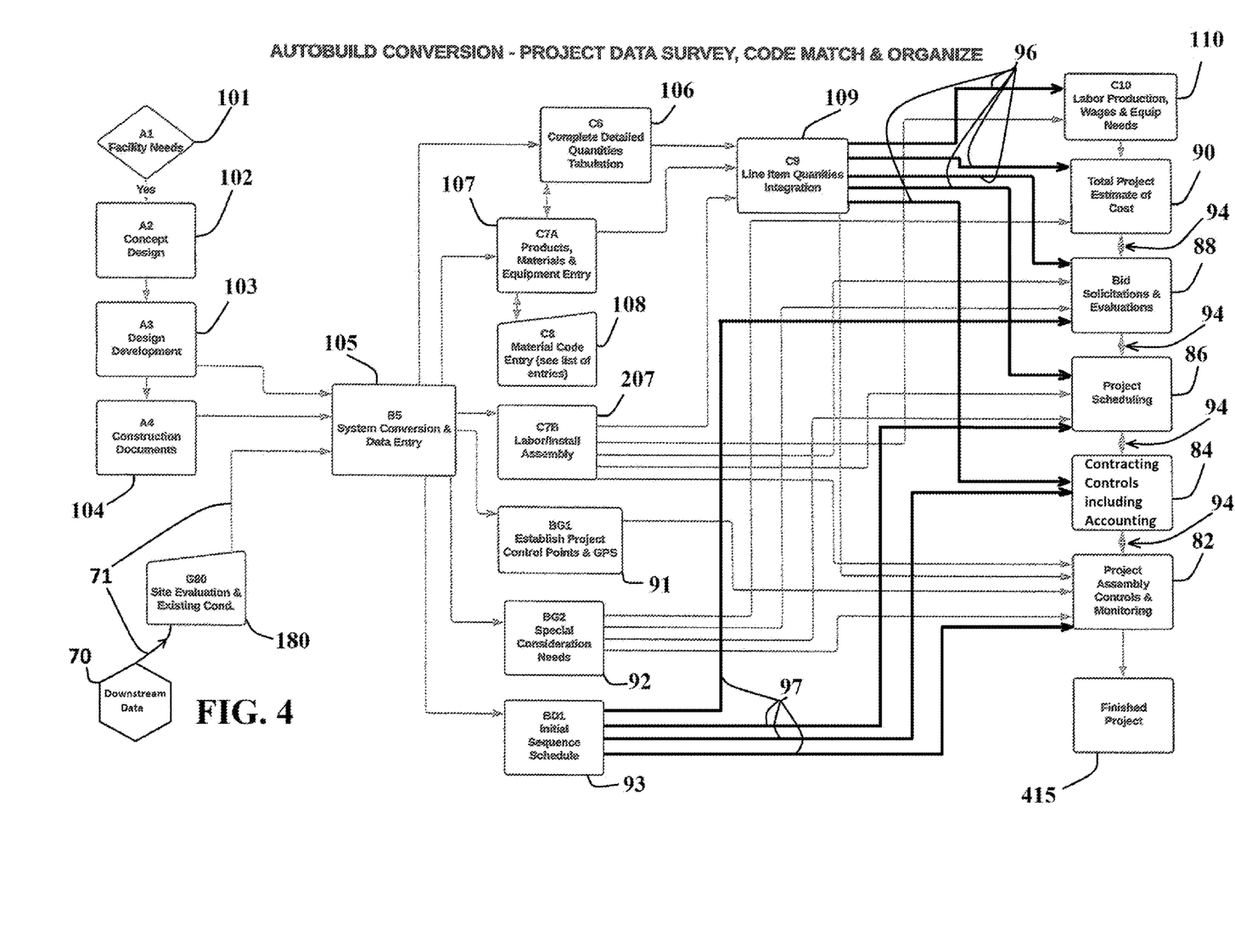
FIG. 4 is a fourth flowchart diagram more detailed as compared to the third flowchart diagram of FIG. 3 further depicting the centralized System Conversion and Data Entry software module or node in downflow communication from the series of data input streams with the first series of branching software modules or nodes in downflow communication from the System Conversion and Data Entry software module, and the second series of branching software modules or nodes in downflow communication from the first series of branching software modules or nodes with bi-directional communications depicted between the second series of branching software modules or nodes.

As an example, the C9 Node 109 communicates as at heavy lining 96 with (a) the C10—Labor Production, Wages & Equipment Needs Node 110; (b) the Total Project Estimate of Cost Node as at 90; (c) the Project Scheduling Node as at 86; and (d) the Contracting Controls Node as at 84. All this information and data is needed and can be utilized in the "Bid Solicitation & Evaluations" process Node as at 88 with which the C9 Node 109 further communicates as at 96. This network of communication governed by the B & C Modules comprehensively provides the information required for vendors to properly bid the project and for the evaluation of those bids to be correctly analyzed using all the exact same information. The AutoBuild Conversion Module B oversees, governs, or manages the common categorization, organization, and communication infrastructure required so that all systems are per se working on the same page.

Another example may be understood by referencing the Initial Sequence Schedule BD1 Node 93 in communication (as at heavy lining 97) with (a) the Bid Solicitation & Evaluations Node 88; (b) the Project Scheduling Node 86; (c) the Contracting Controls Node 84; and (d) the Project Assembly Controls & Monitoring Node 82. All the information and data provided by these nodes is required and can be utilized by each of the same four components of the building process: Bid Solicitation & Evaluations, Project Scheduling, Contracting Controls, and Project Assembly Controls & Monitoring and all being done with the common categorization, organization, communication, and management that is being utilized within the AUTOBUILD CONVERSION so that all systems are per se working on the same page. The foregoing examples are but two examples of the numerous benefits that the AUTOBUILD CONVERSION system can provide to the entire construction process to make it most comprehensive, expeditious, cost-effective and error free.

While the above descriptions contain much specificity, this specificity should not be construed as limitations on the scope of the invention, but rather as an exemplification of the invention. The foregoing specifications are contemplated to essentially provide a data conversion system for converting project design data into a unified system and language for enabling further design input management and to allow for automated construction processes as generally illustrated in FIGS. 1-4 within a construction project management system as generally described and illustrated in more detail in the '714 Application.

The data conversion system comprising according to the present invention may be said to essentially comprise a series of networked computers, and a series of computer-implementable software-based modular components. The series of networked computers are in communication with one another and configured to implement a series of non-transitory, computer-implementable, software-based modular components allowing particularized directional inter-module communication therebetween.

The series of computer-implementable, software-based modular components essentially comprise a centralized or hub-like design input conversion and management software module component as at 105. The centralized design input conversion and management software module component 105 receives data from at least one upstream software module component source and sends data to at least downstream software module component.

The centralized design input conversion and management software module component 105 preferably receives digital design data for a designed project as received from a design provider and converts the digital design data into a revised format for enabling and supporting peripheral software module components in networked, inter-module communication with the centralized design input conversion and management software module component thereby enabling peripheral software module component functionality most particularly downstream therefrom.

The centralized design input conversion and management software module component 105 is preferably in unidirectional downstream communication with the at least one design data software module component. The at least one upstream software module component source is preferably a design data software module component as generally described and referenced at 95 comprising the so-called A1-A4 software node components 101, 102, 103, and 104. The design data software module component essentially comprises a Design Development software module component as at 103 and a Construction Documents software module component as at 104, which Design Development software module component 103 and the Construction Documents software module component 104 are in direct parallel communication with the centralized design input conversion and management software module component 105.

The upstream software components or the at least one upstream software module component that send(s) data to the centralized design input conversion and management software module component may preferably comprise a Site Evaluation & Existing Condition software module component as at G80 or reference number 180. The Site Evaluation & Existing Condition software module component 180 sends and cycles data from downstream relative to the centralized design input conversion and management software module component or downstream data as at 70 back to (as at arrow 71) the centralized design input conversion and management software module component 105.

The at least one downstream software module component is a Project Data Survey, Code Match & Organize software module component as described and referenced at Module C comprising a series of sub-software module components in downstream parallel communication with the centralized design input conversion and management software module 105. The series of sub-software module components comprising a Complete Detailed Quantities Tabulation software module component as the C6 node or reference number 106; a Products, Materials & Equipment Entry software module component as at the C7A node or reference number 107; and a Labor/Install Assembly software module component as at the C7B node or reference number 207.

The series of sub-software module components as at 106, 107, and 207 send data downstream in parallel relation to a Line-Item Quantities Integration software module component as at the C9 node or reference number 109. The Products, Materials & Equipment Entry software module component as at 107 is preferably in bidirectional communication with both the Complete Detailed Quantities Tabulation software component 106 and a Material Code Entry software module component as at 108.

The centralized design input conversion and management software module 105 may further preferably comprise a series of sub-software module components in downstream parallel communication with the centralized design input conversion and management software module 105. The series of sub-software module components preferably comprise an Establish Project Control Points & GPS software module component as at the BG1 node or reference number 91; a Special Consideration Needs software module component as at the BG2 node or reference number 92; and an Initial Sequence Schedule software module component as at the BD1 node or reference number 93.

Accordingly, although the data conversion system according to the present invention has been described by reference to a number of different features and aspects, it is not intended that the novel descriptions and systemic interactions thereof be limited thereby, but that modifications thereof are intended to be included as falling within the broad scope and spirit of the foregoing disclosure, the appended drawings, and the following claims.

What is claimed is:

1. A data conversion system for converting digital project design data into a unified system and language for enabling and supporting construction automation processes, the data conversion system comprising, in combination:
    a plurality of networked computers being in communication with one another and being configured to implement a plurality of non-transitory, computer-implementable, software-based components allowing directional inter-component communication therebetween and that comprise:
    a centralized design input conversion and management software component being configured to:
    receive digital project design data for a project design from at least one upstream software component source;
    analyze the digital project design data for errors to properly enable and support downstream automation processes to support a complete construction of the project design in an automated manner;
    alert a user if corrections are required for supporting the project design and the complete construction thereof;
    convert the digital project design data into a standardized data format that enables peripheral software components in networked, inter-communication with the centralized design input conversion and management software component to perform automated peripheral software component functions; and
    send the digital project design data as converted to the standardized data format to at least one downstream software component for enabling and supporting completion of the project design and the complete construction thereof in the automated manner.

2. The data conversion system of claim 1 wherein the at least one upstream software component source is a design data software component.

3. The data conversion system of claim 2 wherein the centralized design input conversion and management software component is in unidirectional downstream communication with the at least one design data software component for receiving the digital project design data for the project design and the at least one downstream software component is in unidirectional downflow communication with the centralized design input conversion and management software component for receiving the digital project design data as converted to the standardized data format from the centralized design input conversion and management software component.

4. The data conversion system of claim 2 wherein the design data software component comprises a Design Development software component and a Construction Documents software component, the Design Development software component and the Construction Documents software component being in parallel communication with the centralized design input conversion and management software component.

5. The data conversion system of claim 4 wherein the at least one upstream software component source is a Site Evaluation & Existing Condition software component, the Site Evaluation & Existing Condition software component configured to cycle data from downstream relative to the centralized design input conversion and management software component back to the centralized design input conversion and management software component.

6. The data conversion system of claim 1 wherein the at least one downstream software component is a Project Data Survey, Code Match & Organize software component.

7. The data conversion system of claim 6 wherein the Project Data Survey, Code Match & Organize software component comprises a plurality of sub-software components in downstream parallel communication with the centralized design input conversion and management software component, the plurality of sub-software components comprising a Complete Detailed Quantities Tabulation software component, a Products, Materials & Equipment Entry software component, and a Labor/Install Assembly software module component.

8. The data conversion system of claim 7 wherein the plurality of sub-software components is configured to send data downstream in parallel relation to a Line-Item Quantities Integration software component.

9. The data conversion system of claim 7 wherein the Products, Materials & Equipment Entry software component is in bidirectional communication with the Complete Detailed Quantities Tabulation software component and a Material Code Entry software component.

10. The data conversion system of claim 1 wherein the centralized design input conversion and management software comprises a plurality of sub-software components in downstream parallel communication with the centralized design input conversion and management software component, the plurality of sub-software components comprising an Establish Project Control Points & GPS software component, a Special Consideration Needs software component, and an Initial Sequence Schedule software component.

11. The data conversion system of claim 1 wherein the centralized design input conversion and management software component is configured to receive and convert the digital project design data into information usable by automated systems to complete the project design and construction thereof.

12. A data conversion system operable within a computer network environment configured to implement a plurality of non-transitory, computer-implementable, software-based components allowing directional inter-component communication therebetween, the data conversion system comprising:
a centralized design input conversion and management software component and at least one computer for implementing the centralized design input conversion and management software component configured to:
receive digital project design data for a project design from at least one upstream software component source;
analyze the digital project design data for errors to properly enable and support downstream automation processes to support construction of the project design in an automated manner;
alert a user if corrections are required for supporting a complete construction of the project design;
convert the digital project design data into a standardized format that enables peripheral software components in networked, inter-communication with the centralized design input conversion and management software component to perform automated peripheral software component functions; and
send the digital project design data as converted to the standardized data format to at least downstream software component for enabling and supporting completion of the project design and the construction thereof in the automated manner.

13. The data conversion system of claim 12 wherein the at least one upstream software component source is a design data software component.

14. The data conversion system of claim 13 wherein the centralized design input conversion and management software component is in unidirectional downstream communication with the at least one design data software component for receiving the digital project design data for the project design and the at least one downstream software component is in unidirectional downflow communication with the centralized design input conversion and management software component for receiving the digital project design data as converted to the standardized data format from the centralized design input conversion and management software component.

15. The data conversion system of claim 13 wherein the design data software component comprises a Design Development software component and a Construction Documents software component, the Design Development software component and the Construction Documents software component being in parallel communication with the centralized design input conversion and management software component.

16. The data conversion system of claim 12 wherein the at least one upstream software component source is a Site Evaluation & Existing Condition software component configured to cycle data from downstream relative to the centralized design input conversion and management software component back to the centralized design input conversion and management software component.

17. The data conversion system of claim 12 wherein the at least one downstream software component is a Project Data Survey, Code Match & Organize software component.

18. The data conversion system of claim 17 wherein the Project Data Survey, Code Match & Organize software component comprises a plurality of sub-software components in downstream parallel communication with the centralized design input conversion and management software component, the plurality of sub-software components comprising a Complete Detailed Quantities Tabulation software component, a Products, Materials & Equipment Entry software component, and a Labor/Install Assembly software component.

19. The data conversion system of claim 18 wherein the plurality of sub-software components is configured to send data downstream in parallel relation to a Line-Item Quantities Integration software component.

20. The data conversion system of claim 19 wherein the Products, Materials & Equipment Entry software component is in bidirectional communication with the Complete Detailed Quantities Tabulation software component and a Material Code Entry software component.

21. The data conversion system of claim 12 wherein the centralized design input conversion and management software component comprises a plurality of sub-software components in downstream parallel communication with the centralized design input conversion and management software component, the plurality of sub-software components comprising an Establish Project Control Points & GPS software component, a Special Consideration Needs software component, and an Initial Sequence Schedule software component.

22. The data conversion system of claim 12 wherein the centralized design input conversion and management software component is configured to receive and convert the digital project design data into information usable by automated systems to complete the project design and construction thereof.

23. A non-transitory, computer-implementable, software-based construction project management platform operable within a computer network environment configured to implement at least a data conversion system operable therewithin, the data conversion system comprising:
 a centralized design input conversion and management software component and at least one computer for implementing the centralized design input conversion and management software component configured to:
 receive digital project design data for a project design from at least one upstream software component source;
 analyze the digital project design data for errors;
 alert a user if corrections are required for supporting a complete construction of the project design;
 convert the digital project design data into a standardized format that enables at least a second platform-supportive, peripheral software component in networked, inter-component communication therewith to perform peripheral software component functions; and
 send the digital project design data as converted to the standardized format to at least one downstream software component for governing automation of the project design and carry out a physical construction thereof.

24. The construction project management platform according to claim 23 wherein the centralized design input conversion and management software component is in unidirectional downflow communication with at least one design data software component and the at least one downstream software component is in unidirectional downflow communication with the centralized design input conversion and management software component configured to:
 receive the digital project design data in a first format from the at least one design data software component;
 perform data conversion of the digital project design data into the standardized format, the data conversion providing data formatting being configured to track, calculate, and manage multiple aspects of a construction project; and
 send the digital project design data as converted to the standardized format to the at least one downstream software component in a manner that enables said downstream software component to recognize design data information in the standardized format and to successfully carry out peripheral component functionality.

25. The construction project management platform according to claim 24 wherein the peripheral component functionality is provided by at least a plurality of platform-supportive peripheral software components, the plurality of platform-supportive, software-based components together being cooperable for managing an entire construction project build from design input through to final build within a system of automation.

26. The construction project management platform according to claim 25 wherein the plurality of platform-supportive peripheral software components includes at least the second, platform-supportive peripheral software component and a third, platform-supportive peripheral software component wherein:
 the second, platform-supportive peripheral software component is in communication with the centralized design input conversion and management software component and is configured to code and quantify a plurality of material support elements to complete the project design; and
 the third, platform-supportive peripheral software component is in communication with at least the second, platform-supportive peripheral software component and is configured to provide a preliminary schedule for the project design and is configured to update the preliminary schedule as update data is received by the third, platform-supportive peripheral software component by way of peripheral software components in communication therewith.

27. The construction project management platform according to claim 26 wherein the plurality of platform-supportive peripheral software components includes at least the second, platform-supportive peripheral software component through a fourth, platform-supportive peripheral software component wherein:
 the fourth, platform-supportive peripheral software component is in communication with at least the second and third, platform-supportive peripheral software components and is configured to prequalify subcontractors and/or suppliers based on a number of select parameters, and manage a bid process.

28. The construction project management platform according to claim 27 wherein the plurality of platform-supportive peripheral software components includes at least the second, platform-supportive peripheral software component through a fifth, platform-supportive peripheral software component wherein:
 the fifth, platform-supportive peripheral software component is in communication with at least the second and fourth, platform-supportive peripheral software components and is configured to compile a total estimated cost of the project design.

29. The construction project management platform according to claim 28 wherein the plurality of platform-supportive peripheral software components includes at least the second, platform-supportive peripheral software component through a sixth, platform-supportive peripheral software component wherein:

the sixth, platform-supportive peripheral software component is in bidirectional communication with at least the first, third, and fifth, platform-supportive peripheral software components and is configured to activate and govern the physical build of the project design on a select site monitoring in real-time project progress as each material support element is injected into the project design.

30. The construction project management platform according to claim 25 wherein the plurality of platform-supportive, software-based components are configured to be cooperable with peripheral fields of art so as to embrace and adjust to technological advances in the peripheral fields of art and accordingly update the construction project management system so as to enhance the functionality thereof.

31. The construction project management platform according to claim 30 wherein select platform-supportive, software-based components of the plurality of platform-supportive, software-based components are configured to enhance peripheral fields of art by communicating therewith in a bi-directional manner.

32. The construction project management platform according to claim 23 comprising, in combination, a vendor system, the vendor system comprising a plurality of non-transitory, computer-implementable, software-based components substantially similar to those of the construction project management system with variations for enhancing vendor contributions thereto.

33. The construction project management platform of claim 23 wherein the centralized design input conversion and management software component receives and converts the digital project design data into information usable by automated systems to complete the project design and construction thereof in an automated manner.

* * * * *